United States Patent
Yamada

(10) Patent No.: US 8,102,016 B2
(45) Date of Patent: Jan. 24, 2012

(54) SEMICONDUCTOR INTEGRATED CIRCUIT DEVICE AND METHOD FOR MANUFACTURING SAME

(75) Inventor: Tetsuya Yamada, Gifu (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 745 days.

(21) Appl. No.: 11/808,235

(22) Filed: Jun. 7, 2007

(65) Prior Publication Data

US 2008/0001242 A1    Jan. 3, 2008

(30) Foreign Application Priority Data

Jun. 28, 2006 (JP) .................. 2006-178434

(51) Int. Cl.
*H01L 31/0232* (2006.01)
(52) U.S. Cl. ........... 257/436; 257/294; 257/E21.002; 257/E31.127
(58) Field of Classification Search .......... 257/436, 257/294, E21.002, E31.127
See application file for complete search history.

(56) References Cited

U.S. PATENT DOCUMENTS

| 6,376,871 B1 | 4/2002 | Arai |
| 2004/0017628 A1 | 1/2004 | Murade |
| 2004/0023469 A1* | 2/2004 | Suda .................. 438/458 |
| 2007/0164335 A1* | 7/2007 | McKee ................ 257/294 |
| 2008/0128701 A1* | 6/2008 | Kim et al. ............ 257/59 |

FOREIGN PATENT DOCUMENTS

| JP | A-2001-060713 | 3/2001 |
| TW | A-2004-02669 | 2/2004 |

OTHER PUBLICATIONS

Mar. 25, 2011 Office Action issued in corresponding Taiwanese Patent Application No. 96122992.

* cited by examiner

*Primary Examiner* — Cathy N. Lam
(74) *Attorney, Agent, or Firm* — Oliff & Berridge, PLC

(57) ABSTRACT

In a light detector that is a semiconductor integrated circuit, a wiring structure is disposed on a semiconductor substrate along a periphery of a rectangular region that corresponds to a light receiver, and an interlayer insulating film composed of an SOG film is layered over the wiring structure. In this structure, the interlayer insulating film is thicker at a corner than at a center part of the light receiver. In order to increase efficiency of the incidence of light on the light receiver, the planar shape of the open part is formed so that the corners of the rectangle that surrounds the wiring structure are removed when the interlayer insulating film is etched and the open part is formed (i.e., yielding an octagonal shape). Accordingly, the effects of differences in the thickness of the interlayer film at the center part and corners of the light receiver are avoided, a bottom surface of the open part is formed in a flat manner, and uniformity in the incidence of light from the open part to the light receiver is improved.

7 Claims, 4 Drawing Sheets

(related art)

(related art)

SEMICONDUCTOR INTEGRATED CIRCUIT DEVICE AND METHOD FOR MANUFACTURING SAME

CROSS-REFERENCE TO RELATED APPLICATION

The priority application number JP2006-178434 upon which this patent application is based is hereby incorporated by the reference.

BACKGROUND OF THE INVENTION

1. Field of the Invention

The present invention relates to a semiconductor integrated circuit device, which is an integrated circuit including a light receiver, formed on a semiconductor substrate. In particular, the present invention relates to a semiconductor integrated circuit device having an open part formed by etching an interlayer insulating film layered on the substrate, and to a method for manufacturing the semiconductor integrated circuit device.

2. Description of the Related Art

In recent years, optical disks such as CDs (compact disks) and DVDs (digital versatile disks) have come to occupy an important position as information recording media. In devices for reading these optical disks, laser light is emitted along tracks on the optical disk, and the light reflected is detected by an optical pickup mechanism. Recorded data is then read based on changes in the intensity of the reflected light.

FIG. 1 is a schematic plan view of a conventional light detector 10.

FIG. 2 is a schematic cross-sectional view of the light detector 10 in a cross section that passes through the line A-A' shown in FIG. 1 and is perpendicular to the semiconductor substrate, and shows a light receiver 11 and wiring structures 12.

In order to detect reflected light, the light detector 10 has a light receiver 11 including PIN photo diode (PD) diffusion layers 34 divided into four partitions in a 2 by 2 configuration on a front surface of a semiconductor substrate 14. The PD diffusion layers 34 are divided each other by a dividing diffusion layer 33. The light receiver 11 generates weak photoelectric conversion signals in accordance with reflected incident laser light. The signals are amplified in amplifiers formed on a peripheral region of the light receiver, and are output to a signal processing circuit downstream.

A first interlayer insulating film 16, a first metallic layer 17, a second interlayer insulating film 18, a second metallic layer 19, and a third interlayer insulating film 20 are layered in the stated order onto the semiconductor substrate 14. The first metallic layer 17 and second metallic layer 19 are both formed from, e.g., aluminum (Al) and are patterned using a photolithographic technique. Wiring structures 12 and signal wires 13A and voltage application wires 13B, which are connected to the wire structure 12, are formed by the patterned first metallic layer 17.

The dividing diffusion layer 33 is connected to the voltage application wires 13B via the wiring structures 12, and the electrical potential is kept fixed by the voltage application wires 13B. The photoelectric conversion signal generated by the PD diffusion layer 34 is retrieved by the signal wires 13A via the wiring structures 12.

In the above-described configuration, retaining the frequency characteristics of the photoelectric conversion signal and minimizing the superposition of noise on the photoelectric conversion signal requires low resistance in the electrical connections between the PD diffusion layer 34 and signal wires 13A and between the dividing diffusion layer 33 and the voltage application wires 13B. The wiring structures 12 and the diffusion layers are therefore preferably connected by as many contact structures as possible. For this reason, the wiring structures 12 are disposed along an edge of a planar shape having corners that surrounds the light receiver 11, as shown in FIG. 1.

In order to increase the efficiency of the incidence of light on the light receiver 11, once the metallic layers and interlayer insulating films have been layered onto the semiconductor substrate, the interlayer insulating films and the like layered on the light receiver 11 are etched, and an open part 15 is formed. The open part 15 is formed into a shape that is similar to and somewhat smaller than the shape of the wiring structure 12.

FIG. 3 is a perspective view showing the light receiver 11 and wiring structures 12 of the conventional light detector 10. The wiring structures 12 are disposed so as to surround the light receiver 11 in a shape having corner parts, as shown in FIG. 3. Specifically, the wiring structures 12 are disposed on the PD diffusion layer 34 and on the dividing diffusion layer 33. The wiring structures 12 on the PD diffusion layer 34 and the wiring structures 12 on the dividing diffusion layer 33 are disposed along sides of the rectangular shape that are at right angles to each other. The corner parts sandwiched by the wiring structures 12 on two adjacent sides are formed in the vicinity of apexes of the rectangular shape.

FIG. 4 is a schematic view of a surface of a wafer 21 when the interlayer insulating film on the wiring structures 12 is formed from SOG (spin on glass). A plurality of the light detectors 10 is formed on the wafer 21. The plurality of rectangular regions on the wafer 21 each indicate a light receiver 11 surrounded by the wiring structures 12 in the light detector 10. FIG. 4 shows differences in the thickness of the SOG film within the light receiver 11. In the light receiver 11, the SOG film is thicker in the regions indicated by the lattice pattern than in regions indicated by the solid color.

As is commonly understood, a smooth silicon oxide film is formed by spin coating and baking a glass solution composed of an SOG film dissolved in an organic solvent.

The SOG film is thicker in the regions of the corner parts of the wiring structures 12 in the light receiver 11 than in the region at a center part of the light receiver 11 due to the effects of the surface tension of the organic solvent on the wiring structures 12. In a single wafer 21, the SOG film is thicker at the corner parts of the light receivers 11 formed on outer peripheral sides than at those of the light receivers 11 formed on the central part of the wafer 21 due to a centrifugal force created by spin coating. In addition, when a further interlayer insulating film is sequentially layered onto the interlayer insulating film formed by the SOG film, the uppermost surface of the interlayer insulating film does not have a flat form.

Once the interlayer insulating film has been formed, when the interlayer insulating films and the like layered on the light receiver 11 are removed by anisotropic etching to form the open part 15, the bottom surface of the open part 15 is given the same shape as the surface of the third interlayer insulating layer 20 prior to etching. In other words, the thickness of the interlayer insulating films remaining on the light receiver 11 is greater in regions near the corner parts of the wiring structures 12 than at the center part of the light receiver 11.

Thus, when the bottom surface of the open part is not formed in a flat manner, a possibility exists that the efficiency of incidence on the surface of the light receiver cannot be made uniform. A possibility also exists that the portions where the bottom surface of the open part is not flat will reflect light and thereby adversely affect photoelectric conversions made by the light detector.

Japanese Laid-open Patent Application Publication No. 2001-60713 discloses the light detector that is the prior art of the invention of the present application.

SUMMARY OF THE INVENTION

According to the present invention, there is provided a semiconductor integrated circuit device comprising a light receiver formed on a semiconductor substrate; a wiring structure disposed on the semiconductor substrate along an edge of a planar shape that surrounds the light receiver and has a corner part; an interlayer insulating film formed by an SOG film on the semiconductor substrate and the wiring structure; and an open part formed by etching the interlayer insulating film formed on the light receiver; wherein the open part has a beveled shape in which a portion that corresponds to the corner part is removed from the planar shape whose outline is formed by the wiring structure.

DESCRIPTION OF THE PREFERRED EMBODIMENTS

Embodiments of the present invention shall be described below with reference to the drawings.

Figure 1:
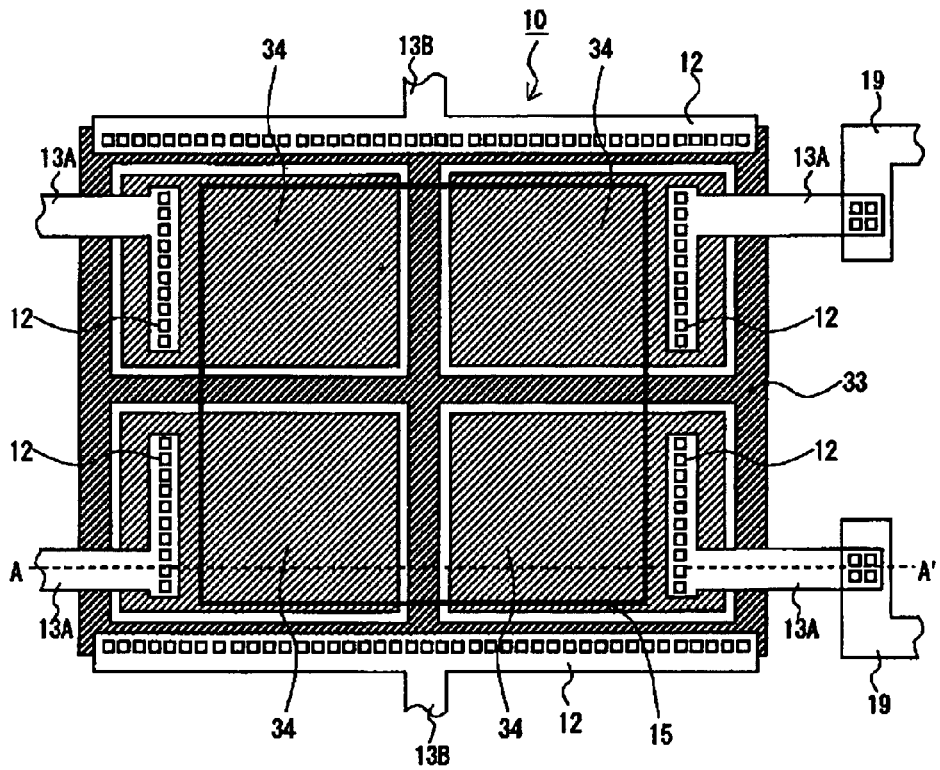
FIG. 1 is a schematic plan view of a conventional light detector.
Figure 2:
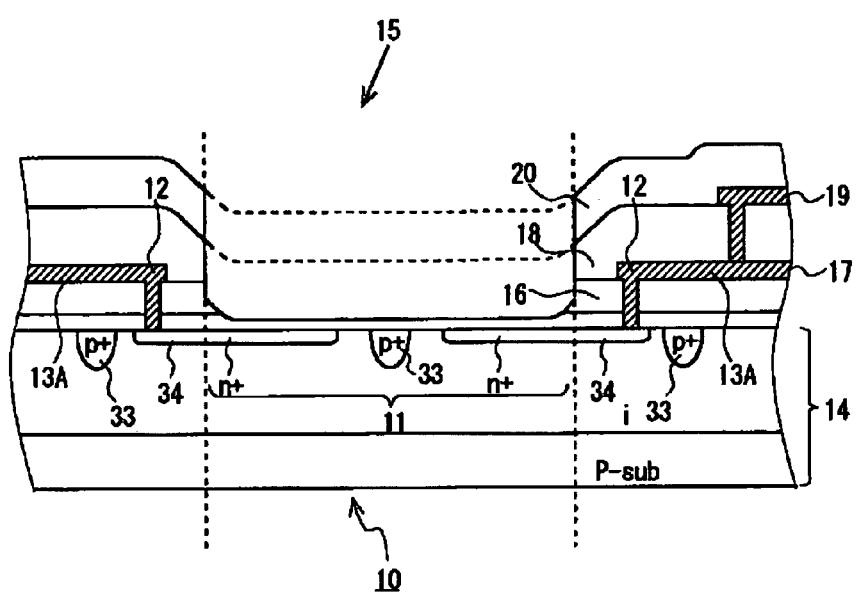
FIG. 2 is a schematic cross-sectional view of a conventional light detector.
Figure 3:
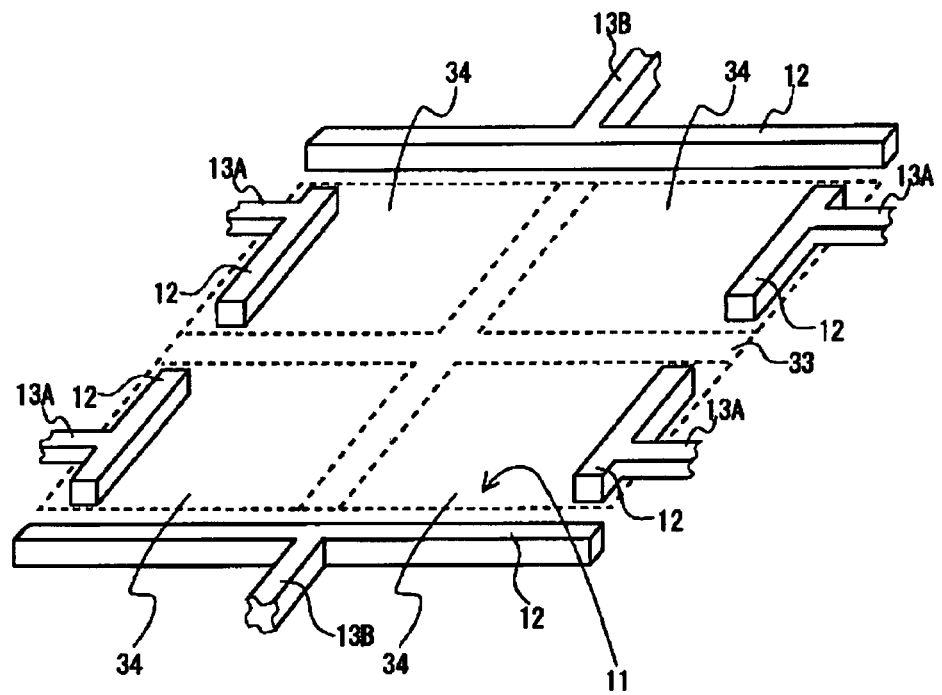
FIG. 3 is a perspective view showing an arrangement of a light receiver and a wiring structure.
Figure 4:
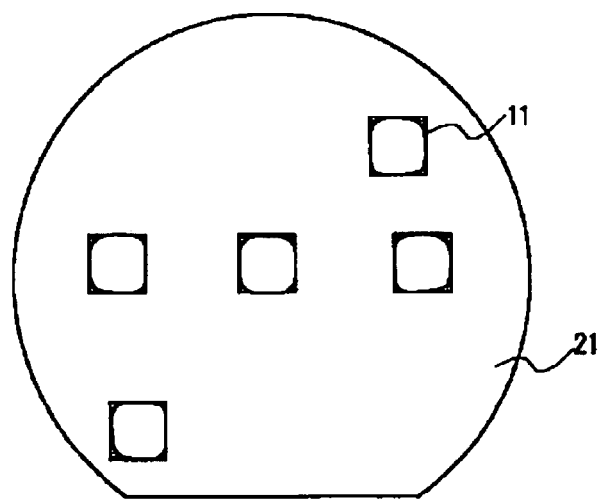
FIG. 4 is a schematic view of a wafer coated with an SOG film.
Figure 5:
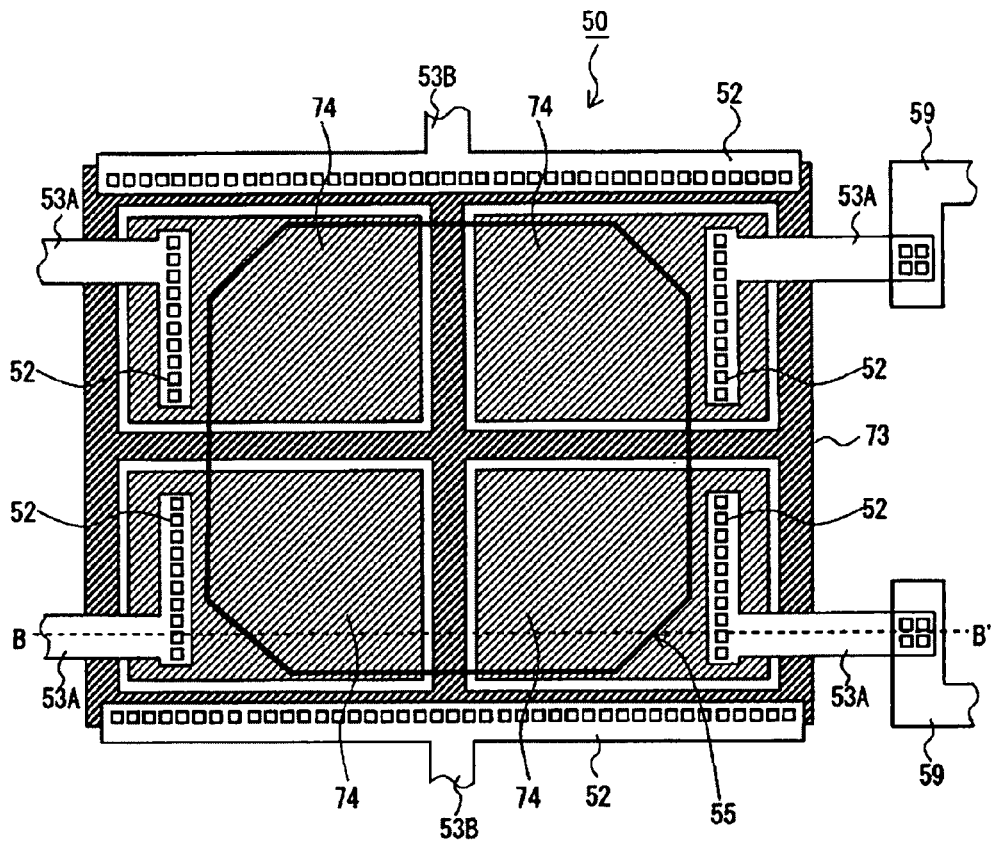
FIG. 5 is a schematic plan view of the light detector according to the present embodiment.

FIG. 5 is a schematic plan view of a light detector 50 of the present embodiment.

Figure 6:
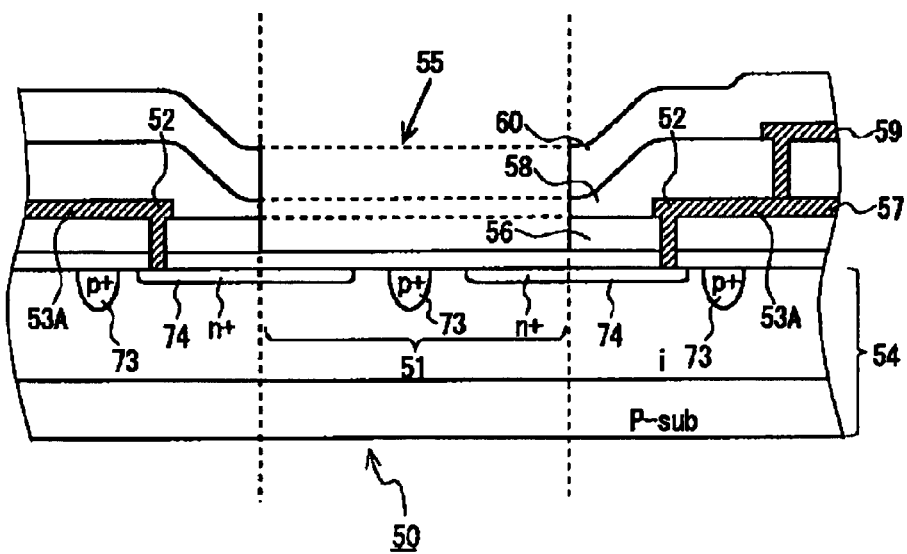
FIG. 6 is a schematic cross-sectional view of the light detector according to the present embodiment.

FIG. 6 is a schematic cross-sectional view of the light detector 50 in a cross section that passes through the line B-B' shown in FIG. 5 and is perpendicular to a semiconductor substrate, and shows a light receiver 51 and wiring structures 52.

In the light detector 50 for detecting reflected light, the light receiver 51 is situated on a surface of a semiconductor substrate 54. The light receiver 51 has four PIN photo diodes (PD) arranged in a two by two configuration. A PD diffusion layer 74 provided to the PDs is formed as, e.g., a cathode region in which a high concentration of n-type impurities are diffused. The PD diffusion layers 74 are divided each other by a dividing diffusion layer 73. The dividing diffusion layer 73 is formed on a surface of the semiconductor substrate 54 as, e.g., an anode region in which a high concentration of p-type impurities are diffused. The PD diffusion layer 74 is formed as the cathode region, whereby only the electrons in electrical charges generated by reflected laser light striking the light receiver 51 are collected in the PD diffusion layer 74 as signal electric charges.

A first interlayer insulating film 56, a first metallic layer 57, a second interlayer insulating film 58, a second metallic layer 59, and a third interlayer insulating layer 60 are formed in the stated order on the semiconductor substrate 54. The first metallic layer 57 and second metallic layer 59 are formed from, e.g., aluminum (Al) and are patterned using a photolithographic technique. The signal wires 53A and voltage application wires 53B, which are connected to the wiring structures 52, and the wiring structures 52 are formed by the patterned first metallic layer 57.

In the present embodiment, the wiring structures 52 are formed on the semiconductor substrate 54, and disposed along an edge of a rectangular shape surrounding the light receiver 51, as shown in FIG. 5. Therefore, corner parts that are sandwiched and recessed between the wiring structures 52 are formed at the four corners of the light receiver 51.

The wiring structures 52 are electrically connected to the PD diffusion layers 74 and the dividing diffusion layer 73 by a plurality of contact holes. The electrical potential of the dividing diffusion layer 73 is thereby kept fixed by the voltage application wire 53B via the wiring structure 52. For example, grounding potential is applied to the dividing diffusion layer 73. A photoelectric conversion signal generated by the PD diffusion layer 74 is received via the signal wire 53A via the wiring structure 52.

Once the PD diffusion layer 74, dividing diffusion layer 73, and wiring structure 52 have been connected, an interlayer insulating film 58 is formed by a SOG film. The SOG film is thicker at the corner parts sandwiched by the wiring structure 52 on the light receiver 51 than at a center part of the light receiver 51. On a single wafer, the SOG film is thicker at the corner parts of the wiring structures 52 formed on an outer periphery of the wafer than at the corner parts of the wiring structures 52 formed on a center part of the wafer.

Once the metallic layers and interlayer insulating films have been applied, the SOG film layered on the light receiver 51 is etched and an open part 55 is formed in order to increase the efficiency of the incidence of reflected light on the light receiver 51.

In the present embodiment, there is formed an open part 55 that has a planar shape in which portions corresponding to the corner parts are beveled. For example, an opening 55 having an octagonal shape is formed.

Thus, in the light receiver 51, a portion where the SOG film has a flat thickness is selected, and the open part 55 is provided at that location. In other words, the open part 55 is formed with the exception of the regions at the corner parts of the wiring structures 52 where the SOG film is formed thicker than at the center part. A bottom surface of the open part 55 can thereby be made flatter than in the prior art.

As described above, the bottom surface of the open part can be made flat, and the efficiency of incidence on the surface of the light receiver can therefore be made uniform. It is possible to minimize any adverse effect on the photoelectric conversions of the light detector that can occur due to the reflection of light by the non-flat portions of the bottom surface of the open part.

Figure 7:
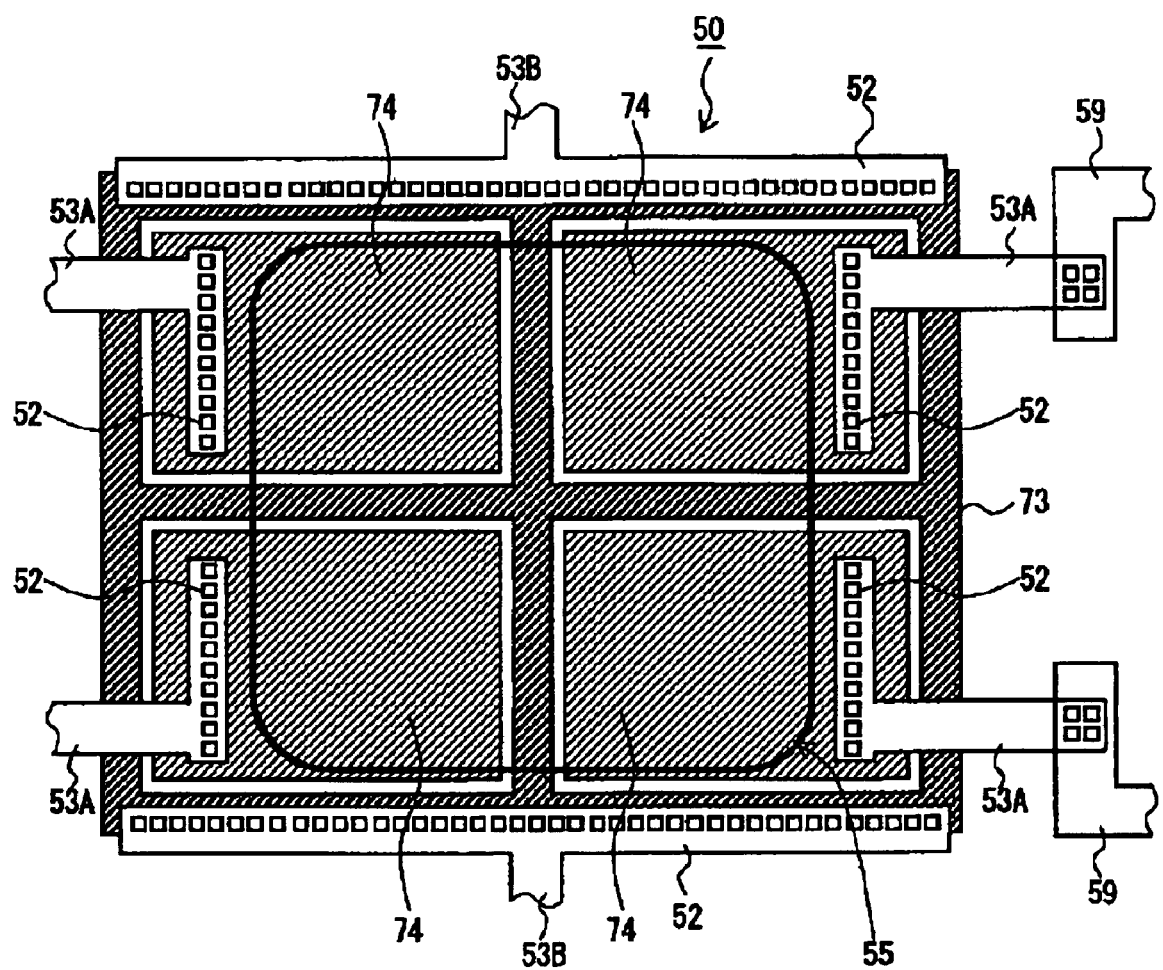
FIG. 7 is a schematic plan view of the light detector according to the present embodiment.

In the above-described present embodiment, there has been described a light detector in which the planar shape of the open part formed on the light receiver is octagonal. However, the open part may have a polygonal shape other than an octagon. The shape of the open part corresponding to the corner parts of the wiring structures 52 may also be rounded, as shown in FIG. 7.

The present invention thus does not require the introduction of a new device or step other than changing a mask when the open part is formed.

The invention claimed is:

1. A semiconductor integrated circuit device comprising:
a light receiver formed on a semiconductor substrate;
a wiring structure disposed on the semiconductor substrate along an edge of a planar shape that surrounds the light receiver and has a corner part;
an interlayer insulating film formed by an SOG film on the semiconductor substrate and the wiring structure; and
an open part formed by etching the interlayer insulating film formed on the light receiver; wherein
an edge of the open part is formed on the light receiver at a location where the interlayer insulating film has a flat surface and has a beveled shape from a top view in which a portion that corresponds to the corner part is removed from the planar shape whose outline is formed by the wiring structure.

2. The semiconductor integrated circuit device according to claim 1, wherein the open part has a polygonal shape in which the corner part has been beveled in a linear fashion.

3. The semiconductor integrated circuit device according to claim 1, wherein the open part has a shape in which the corner part has been beveled in a rounded fashion.

4. The semiconductor integrated circuit device of claim 3, wherein the open part has a sidewall, the sidewall of the open part forming substantially a right angle with the light receiver.

5. A method for manufacturing a semiconductor integrated circuit device on a semiconductor substrate provided with a light receiver, comprising the steps of:
forming a wiring structure on the semiconductor substrate along a planar edge that surrounds the light receiver and has a corner part;
spin coating an SOG film onto the semiconductor substrate and wiring structure and forming an interlayer insulating film; and
etching the interlayer insulating film formed on the light receiver at a location where the interlayer insulating film has a flat surface and forming an open part; wherein
an edge of the open part is formed into a beveled shape from a top view in which a portion that corresponds to the corner part is removed from the planar shape whose outline is formed by the wiring structure.

6. The method for manufacturing a semiconductor integrated circuit device according to claim 5, wherein the open part has a polygonal shape in which the corner part has been beveled in a linear fashion.

7. The method for manufacturing a semiconductor integrated circuit device according to claim 5, wherein the open part has a shape in which the corner part has been beveled in a rounded fashion.

* * * * *